US009756765B1

(12) United States Patent
Michaud et al.

(10) Patent No.: US 9,756,765 B1
(45) Date of Patent: Sep. 5, 2017

(54) SMALL FORM COMPUTER DATA CENTER RACK

(71) Applicant: MacStadium, Inc., Atlanta, GA (US)

(72) Inventors: Jason A. Michaud, Marietta, GA (US); Michael L. Oken, Atlanta, GA (US); Gregory P. McGraw, Marietta, GA (US)

(73) Assignee: MACSTADIUM, INC., Atlanta, GA (US)

( * ) Notice: Subject to any disclaimer, the term of this patent is extended or adjusted under 35 U.S.C. 154(b) by 0 days.

(21) Appl. No.: 15/174,457

(22) Filed: Jun. 6, 2016

Related U.S. Application Data

(63) Continuation of application No. 29/529,389, filed on Jun. 5, 2015, now Pat. No. Des. 761,246.

(60) Provisional application No. 62/171,853, filed on Jun. 5, 2015.

(51) Int. Cl.
*A47F 7/00* (2006.01)
*H05K 7/20* (2006.01)
*H05K 7/14* (2006.01)

(52) U.S. Cl.
CPC ....... *H05K 7/20736* (2013.01); *H05K 7/1489* (2013.01)

(58) Field of Classification Search
CPC ............ H05K 7/20736; H05K 7/1489; H05K 7/20709; H05K 7/1488; H05K 7/1485; H04Q 1/02; H04Q 2201/02; G06F 1/1601; G06F 1/1613; A47B 47/00; A47B 47/0083; A47B 2097/006; A47F 7/0042; A47F 7/0028; A47F 7/0035; H01L 21/6734; H02J 7/0044; H02J 7/0045

USPC ........ 211/26.2, 26, 134, 187, 186, 191, 190, 211/41.17, 10, 40, 41.12; 361/724, 728, 361/829, 807, 809, 810, 679.49, 679.5; 248/235, 309.1, 675; 312/223.2, 223.3; 320/114, 115
See application file for complete search history.

(56) References Cited

U.S. PATENT DOCUMENTS

| 3,767,059 | A | * | 10/1973 | Seiz | ......................... | B65G 1/02 |
| | | | | | | 211/149 |
| 3,798,507 | A | * | 3/1974 | Damon | ................ | H05K 7/1425 |
| | | | | | | 211/41.17 |
| 4,019,099 | A | * | 4/1977 | Calabro | ............... | H05K 7/1418 |
| | | | | | | 211/41.17 |

(Continued)

*Primary Examiner* — Jennifer E Novosad
(74) *Attorney, Agent, or Firm* — Morris, Manning & Martin, LLP; John R. Harris; R. Lee Strasburger, Jr.

(57) ABSTRACT

A data center mounting rack for mounting and supporting a plurality of generally rectangular small form computer systems in a vertical stacked arrangement. The shelving arrangement comprises a pair of spaced apart vertical end panels supporting a plurality of horizontal mounting shelves. Each of the shelves includes a pair of rows of spaced apart first openings extending along the length of each shelf, for allowing the passage of cabling for computers and for permitting cooling air flow. Each of the shelves also includes a plurality of rows of spaced apart air flow openings in a staggered arrangement. Each of the shelves support a plurality of U-shaped computer system mounting brackets. Each of the mounting brackets supports a rectangular small form computer system in a vertical orientation such that air flow is directed along the top surface and bottom surface by the air flow openings to aid in cooling.

8 Claims, 18 Drawing Sheets

(56) References Cited

U.S. PATENT DOCUMENTS

| | | | | | |
|---|---|---|---|---|---|
| 4,327,835 | A | * | 5/1982 | Leger | H05K 7/1425 211/41.17 |
| 4,335,819 | A | * | 6/1982 | Weisman | H05K 7/1418 211/41.17 |
| 4,407,416 | A | * | 10/1983 | Anderson | H05K 7/183 211/183 |
| 4,476,986 | A | * | 10/1984 | Robinson | A47F 5/005 211/134 |
| 4,501,368 | A | * | 2/1985 | Gill | H05K 7/1425 211/186 |
| 4,519,016 | A | * | 5/1985 | Bradley | H05K 7/1425 211/41.17 |
| 4,758,928 | A | * | 7/1988 | Wierec | H05K 7/1455 211/41.17 |
| 4,802,593 | A | * | 2/1989 | Romanos | B43M 99/00 211/10 |
| 4,866,576 | A | * | 9/1989 | Umetsu | H05K 7/1425 211/41.17 |
| 4,955,490 | A | * | 9/1990 | Schafer | A47B 96/02 211/187 |
| 4,995,682 | A | * | 2/1991 | Gutner | A47B 88/0455 206/387.15 |
| 5,044,506 | A | * | 9/1991 | Brown | H05K 7/1425 211/26 |
| 5,297,684 | A | * | 3/1994 | Meunier | H05K 7/1412 138/173 |
| 5,394,305 | A | * | 2/1995 | Moral | H05K 7/1425 211/41.17 |
| 5,398,822 | A | * | 3/1995 | McCarthy | H05K 7/1414 211/41.17 |
| 5,590,794 | A | * | 1/1997 | Zachary | B07C 7/02 209/702 |
| 5,757,617 | A | * | 5/1998 | Sherry | G06F 1/184 206/387.15 |
| 5,823,332 | A | * | 10/1998 | Clausen | G11B 33/0433 206/307.1 |
| 5,890,606 | A | * | 4/1999 | Kuipers | H01M 2/1077 211/186 |
| 5,892,662 | A | * | 4/1999 | Verma | H05K 7/1425 211/41.17 |
| 5,912,799 | A | * | 6/1999 | Grouell | G11B 33/126 312/223.2 |
| 6,008,621 | A | * | 12/1999 | Madison | H02J 7/0042 320/107 |
| 6,482,541 | B1 | * | 11/2002 | Bator, Jr. | H01M 2/1077 429/100 |
| 6,719,150 | B2 | * | 4/2004 | Marraffa | H01M 2/1077 211/26 |
| 7,055,704 | B2 | * | 6/2006 | Alter | A47B 57/50 108/51.11 |
| 7,548,429 | B2 | * | 6/2009 | Miller | H01M 2/1077 361/724 |
| 7,595,995 | B2 | * | 9/2009 | Hock | G06F 1/263 312/223.2 |
| 8,238,082 | B2 | * | 8/2012 | Salpeter | H05K 7/1488 361/679.02 |
| 8,376,157 | B2 | * | 2/2013 | Jarvis | A47B 47/045 108/147.12 |
| 8,443,992 | B2 | * | 5/2013 | Lawson | A47B 47/024 211/187 |
| 8,490,800 | B2 | * | 7/2013 | Noble Colin | A47F 5/0087 211/150 |
| 8,684,191 | B2 | * | 4/2014 | Hosey | H05K 7/1424 211/41.17 |
| 8,752,848 | B2 | * | 6/2014 | Petrick | H01R 13/465 280/47.35 |
| 9,411,525 | B2 | * | 8/2016 | Frink | G06F 1/187 |
| 2002/0006026 | A1 | * | 1/2002 | Takahashi | H05K 7/1418 361/679.46 |
| 2004/0040922 | A1 | * | 3/2004 | Ko | A47B 81/04 211/153 |
| 2004/0057216 | A1 | * | 3/2004 | Smith | G06F 1/3287 361/724 |
| 2004/0155003 | A1 | * | 8/2004 | Anderson | A47F 5/01 211/191 |
| 2004/0195195 | A1 | * | 10/2004 | Mason | A47F 5/0018 211/134 |
| 2005/0146855 | A1 | * | 7/2005 | Brehm | H05K 7/1454 361/724 |
| 2006/0131252 | A1 | * | 6/2006 | Tobias | A47B 65/10 211/184 |
| 2006/0261025 | A1 | * | 11/2006 | Heyderman | A47F 5/118 211/187 |
| 2008/0244052 | A1 | * | 10/2008 | Bradicich | G06F 1/183 709/223 |
| 2012/0325763 | A1 | * | 12/2012 | Loy | A47F 5/0043 211/134 |
| 2013/0164586 | A1 | * | 6/2013 | Uchida | A47F 5/00 429/96 |
| 2013/0175993 | A1 | * | 7/2013 | Chen | H02J 7/0027 320/114 |
| 2014/0091696 | A1 | * | 4/2014 | Welker | A47F 5/0043 312/408 |
| 2014/0175031 | A1 | * | 6/2014 | Roberts | H02J 7/0027 211/26.2 |
| 2015/0129514 | A1 | * | 5/2015 | Bourdoncle | H05K 7/20727 211/26 |
| 2016/0113421 | A1 | * | 4/2016 | Muzyka | A47B 47/0083 211/85.26 |

* cited by examiner

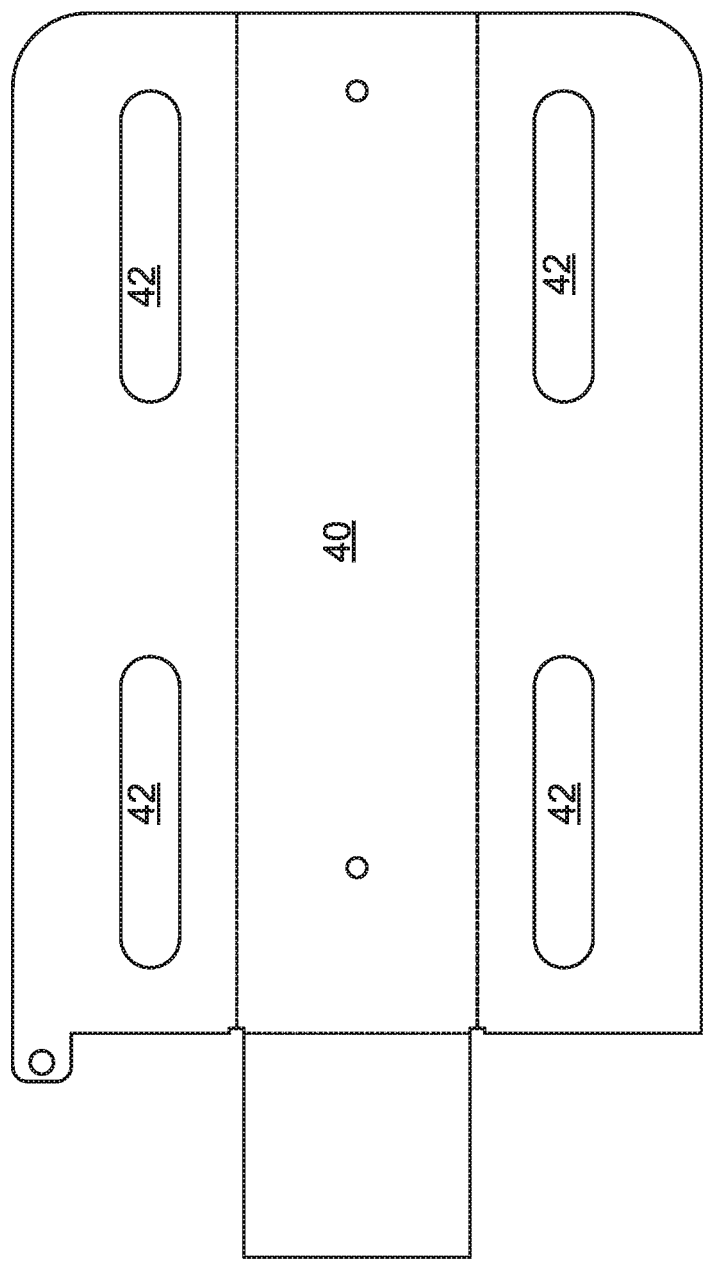

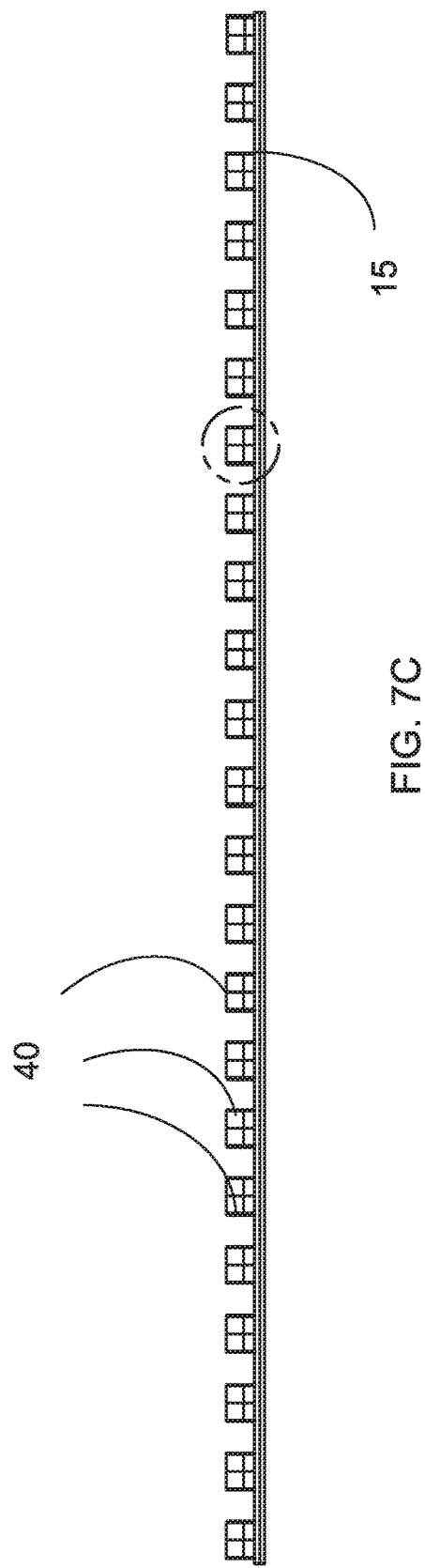

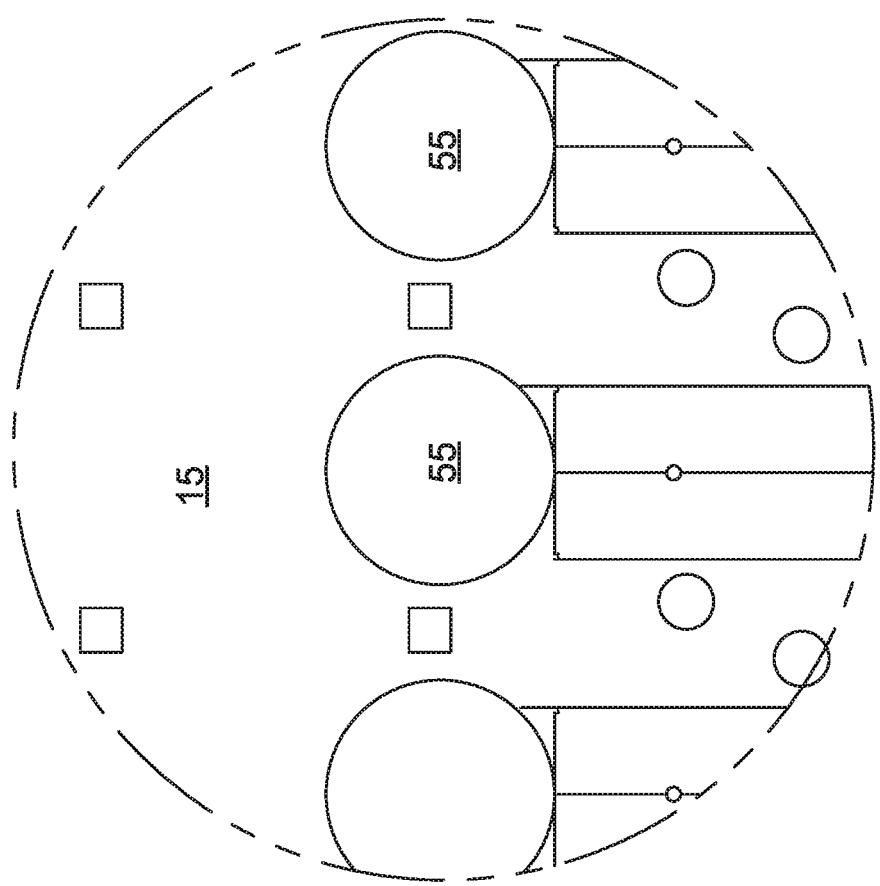

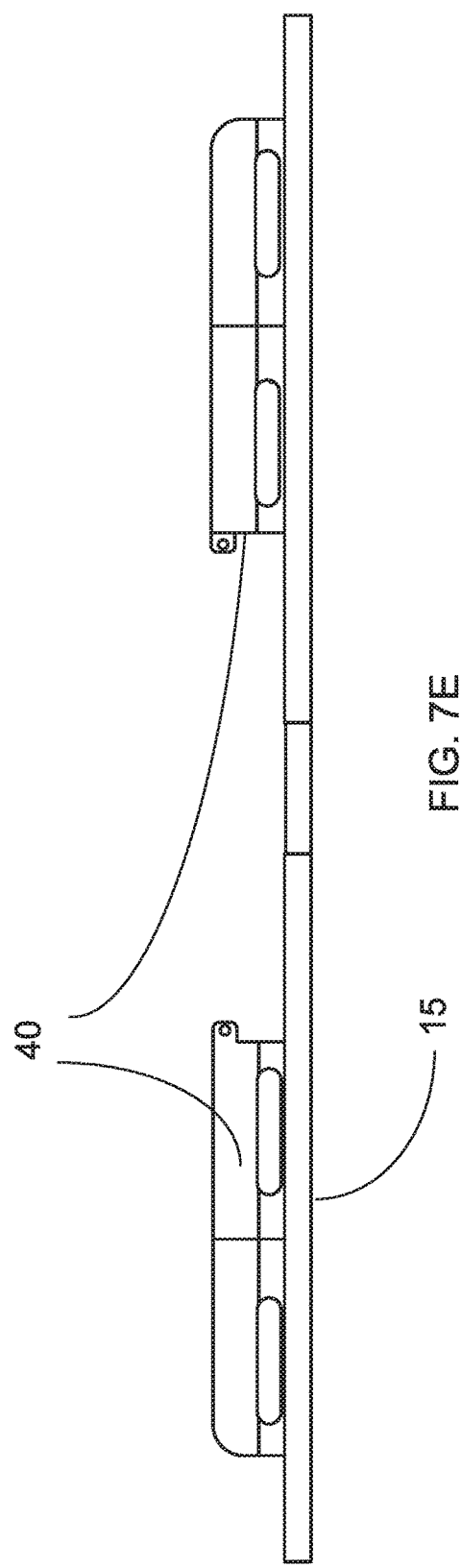

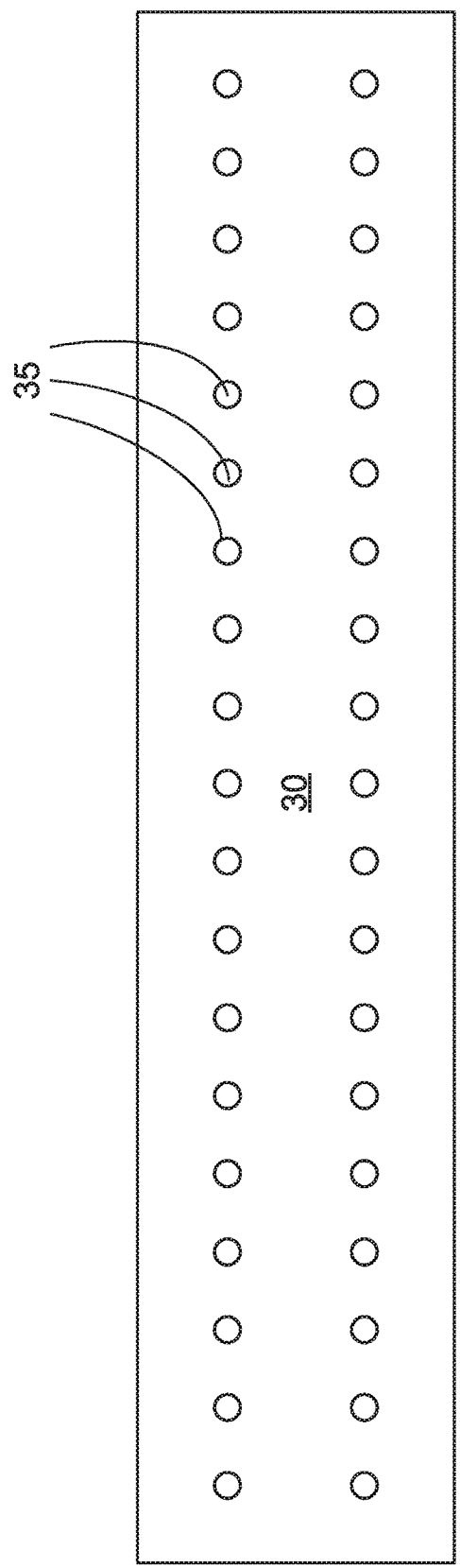

SMALL FORM COMPUTER DATA CENTER RACK

CROSS-REFERENCE TO RELATED APPLICATIONS

This application claims benefit under 35 U.S.C. §119(e) of U.S. Provisional Patent Application No. 62/171,853, filed Jun. 5, 2015, entitled "SMALL FORM COMPUTER DATA CENTER RACK", and U.S. Design patent application Ser. No. 29/529,390, filed Jun. 5, 2015, entitled "SMALL FORM ENCLOSURE FOR COMPUTER DATA CENTER RACK", both of which are incorporated herein by reference as set forth herein in their entirety.

TECHNICAL FIELD

The present disclosure relates generally to the field of storing and organizing small scale computer systems, and more specifically relates to computer center data racks for storing and organizing computer systems having a generally rectangular or parallelepiped configuration with a top surface and bottom surface such as an APPLE® Mac Mini.

BACKGROUND

Computer data centers are facilities that contain racks or shelves of computer systems and their associated components such as power supplies and telecommunications systems. Large data centers house hundreds, often thousands, of separate computers, which are connected for communications with computers in the data center and with telecommunication networks such as the Internet, thereby forming the essential infrastructure of "cloud computing." The racks of computers often extend from floor to ceiling, mounted atop hollow flooring structures called plenums that route cooling air to the various racks, with heat removal vents positioned above the racks. A facility housing thousands of computers uses many kilowatts of electricity and generates large amounts of heat that must be removed so that the computers can operate within their specified ranges of operating temperatures.

Space, cooling, power cabling, and communications cabling requirements are therefore critical for modern data centers. Floor space in terms of square feet footprint per rack and height requirements for each rack of computers are limited, so as to provide required cooling air and power requirements, as well as security within physical cages and accessibility for configuration and maintenance.

One particular type of computer that is popular for certain computing applications is the APPLE® Mac Mini (marketed as "Mac mini"), manufactured by Apple, Inc., Cupertino, Calif. The Mac mini is considered a small form factor self-contained desktop computer but does not include a display, keyboard, or mouse. Although the Mac mini computer is not typically considered to be a data center type computer device, it possesses certain features that make it desirable for deployment in data centers.

For example, the Mac mini computer's processor and associated internal peripheral circuitry make it highly suitable for hosting development environments for the APPLE® computing infrastructure and environment, which is built around the OS X operating system for enterprise and personal computing, and the iOS operating system for mobile devices from Apple, Inc. such as the iPhone and iPad. Other conventional types of computer systems, because they lack the unique circuitry and components of the Apple computing environment, are not readily capable of running OS X or certain iOS development platforms. Thus, the Mac mini computer is highly capable of serving data center needs for conventional data center computing requirements, as well as specialized service to the OS X and iOS development communities.

In contrast, however, the parallelepiped form of the Mac mini computer is not readily suitable for deployment in data centers. The Mac mini computer is manufactured in a small parallelepiped form that contains comparatively large top and bottom panels and comparatively thin lateral sides with rounded edges. Further, the Mac mini computer is manufactured with controls and communication and power ports for the Mac mini computer only on one lateral side. Finally, the Mac mini computer is manufactured with one small fan positioned within its interior that draws air up through the bottom of the Mac mini computer and out the lateral side of the Mac mini computer that contains the controls and ports.

As a result of increasing demand by the OS X and iOS developers' community, there is a need for a data center that can efficiently house computer systems that can provide OS X-compatible hosting environments, as well as other cloud-based computing requirements. The present disclosure relates to a highly space and thermal-efficient data center computer rack mounting arrangement that provides for maximized usage of small form factor self-contained computers such as Mac mini computers.

BRIEF SUMMARY OF THE DISCLOSURE

Briefly described, and according to one embodiment, aspects of the present disclosure generally relate to a small form factor self-contained computer mounting arrangement that allows mounting of up to 46 Mac mini computers or similar devices on a single shelf, up to 10 shelves, for a total of up to 460 Mac mini computers in a single rack assembly, with accessibility from both sides of the rack, and convenient arrangements for power and communications cabling, as well as generally vertical cooling air flow.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWINGS

The accompanying drawings illustrate one or more embodiments and/or aspects of the disclosure and, together with the written description, serve to explain the principles of the disclosure. Wherever possible, the same reference numbers are used throughout the drawings to refer to the same or like elements of an embodiment, and wherein:

FIG. 6D is a top view of a U-shaped mounting bracket prior to assembly.

FIG. 8 illustrates a plan and elevation view of a side panel of the data center mounting rack.

DETAILED DESCRIPTION

Figure 1:
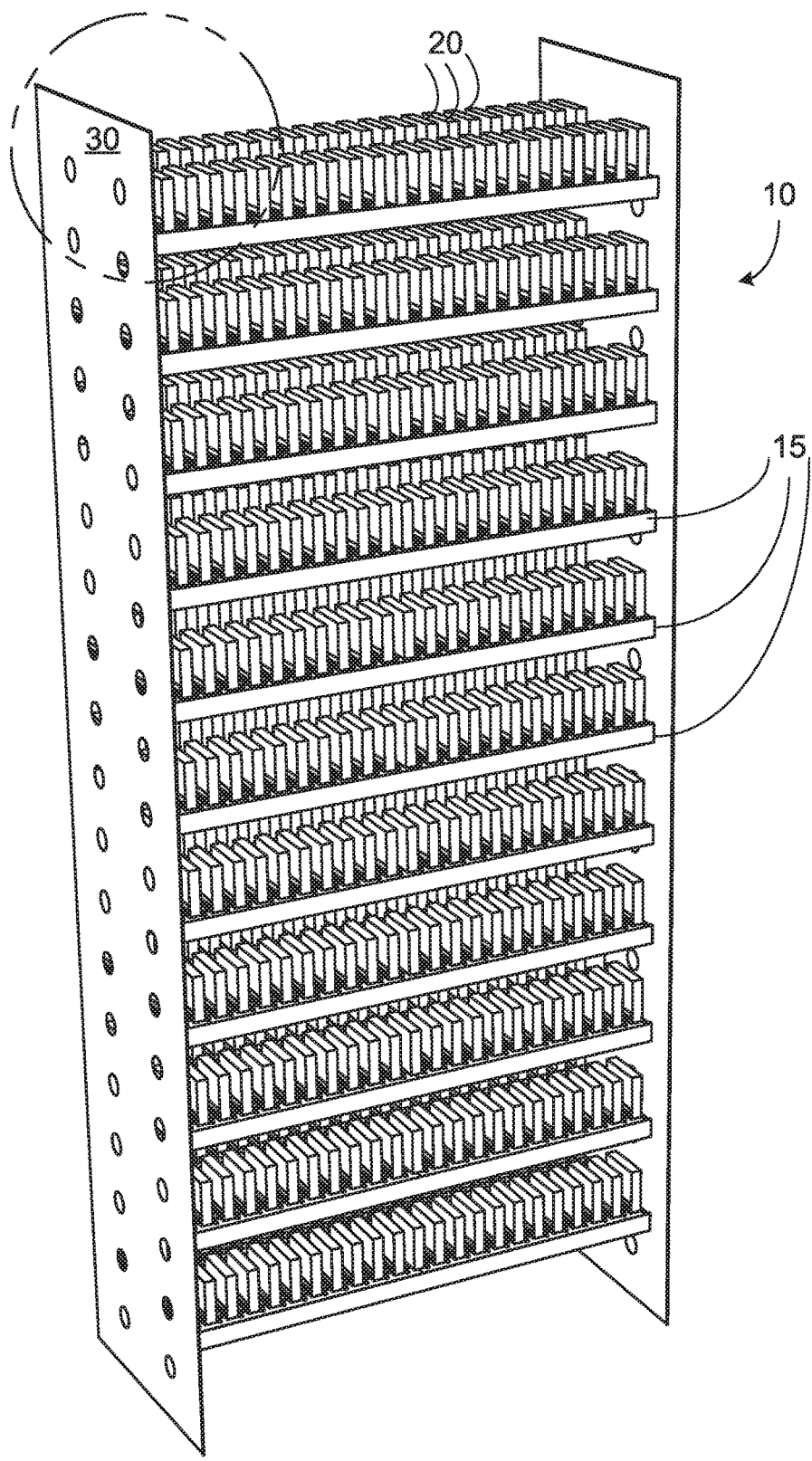
FIG. 1 illustrates a data center mounting rack in accordance with this disclosure, perspective view, front side, populated with 230 Mac mini computers on each side.

For the purpose of promoting an understanding of the principles of the present disclosure, reference will now be made to the embodiments illustrated in the drawings and specific language will be used to describe the same. It will, nevertheless, be understood that no limitation of the scope of the disclosure is thereby intended; any alterations and further modifications of the described or illustrated embodiments, and any further applications of the principles of the disclosure as illustrated therein are contemplated as would normally occur to one skilled in the art to which the disclosure relates. All limitations of scope should be determined in accordance with and as expressed in the claims.

Aspects of the present disclosure generally relate to a small form factor self-contained computer mounting arrangement that allows mounting of up to 46 Mac mini computers or similar devices on a single shelf, up to 10 shelves, for a total of up to 460 Mac mini computers in a single rack assembly, with accessibility from both sides of the rack, and convenient arrangements for power and communications cabling, as well as generally vertical cooling air flow.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

Now referring to the figures, FIG. 1 illustrates a data center mounting rack 10 in accordance with this disclosure, perspective view, front side, populated with 230 Mac mini computers 20 on each side. According to one embodiment, the data center mounting rack may hold 460 Mac mini computers oriented perpendicularly to the shelves 15. In one embodiment, the shelves 15 may hold 46 Mac mini computers. In various embodiments, the data center mounting rack 10 comprises ten shelves spaced equidistant from each other within the data center mounting rack. As will be appreciated by one having ordinary skill in the art, the number of shelves (and height of the data center mounting rack) may be modified to accommodate the requirements of the data center. For example, in on embodiment, the data center mounting rack may comprise 11 shelves (and therefore may hold up to 506 Mac mini computers). In another embodiment, the data center mounting rack may comprise 9 shelves 15 (and therefore may hold up to 411 Mac mini computers).

Figure 2:
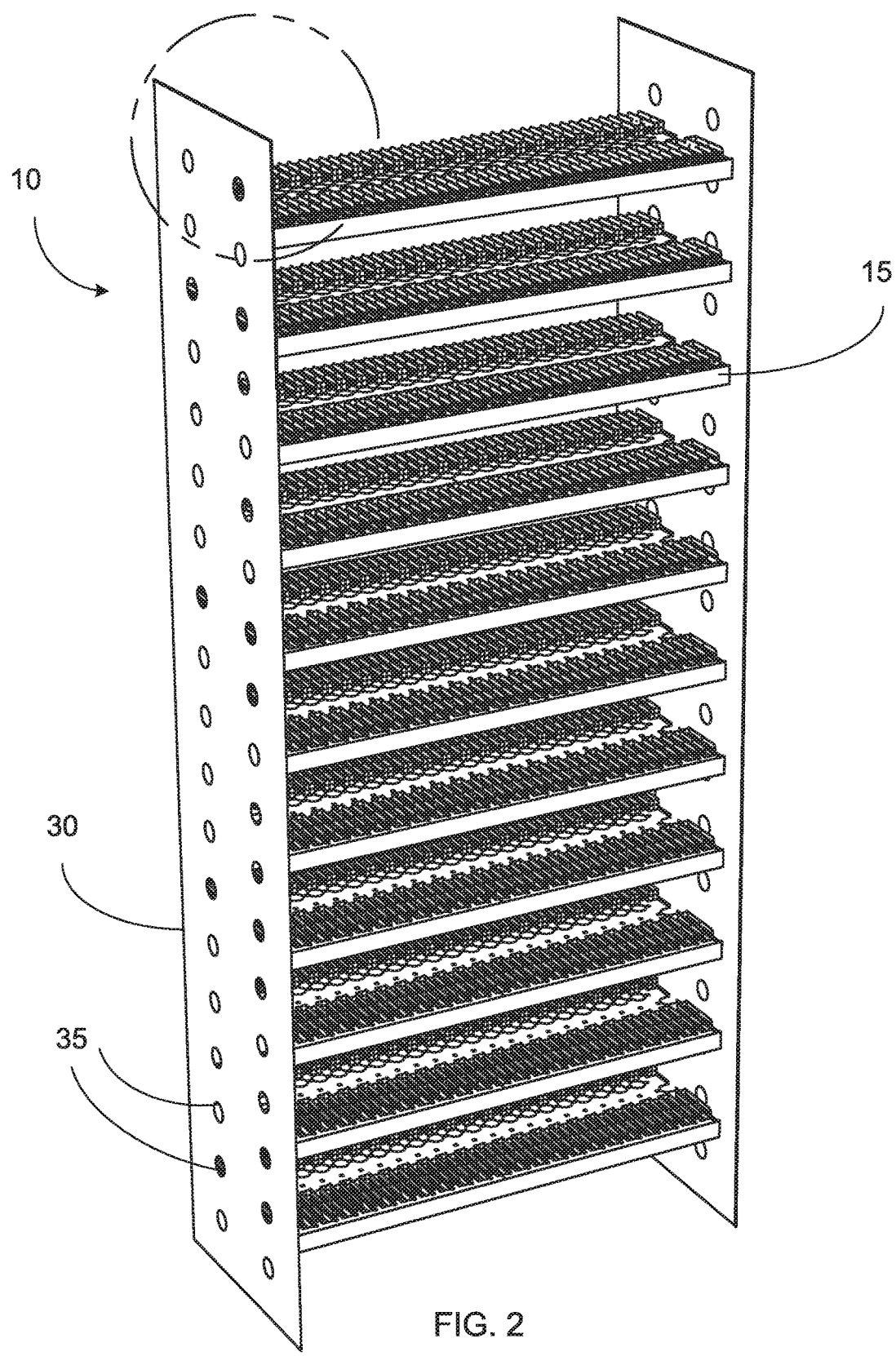
FIG. 2 illustrates a data center mounting rack in accordance with this disclosure, perspective view, without any computers mounted therein, showing the side panels with cable routing openings, and U-shaped mounting brackets.

Referring now to FIG. 2, which illustrates a data center mounting rack 10 in accordance with this disclosure, perspective view, without any computers mounted therein, showing the side panels 30 with cable routing openings 35, and U-shaped mounting brackets 40. In one embodiment, the shelves may be spaced far enough apart to provide for adequate airflow between the Mac mini computers 20 (e.g., sufficient airflow to keep the Mac mini computers operating within their optimal temperature range). As will be appreciated by one having ordinary skill in the art, if the Mac mini computers are not cooled adequately, they will overheat and operate inefficiently which, considering the small, single fan, may happen very easily. In various embodiments, the shelves may be spaced far enough apart to provide adequate space for the various cables (e.g., power, network, etc.) that are necessary to operate the Mac mini computers as servers. In one embodiment, the cables connect to the rear of the Mac mini computers and run in the middle space of the shelves and out the holes in the sides of the data center mounting rack.

Figure 3:
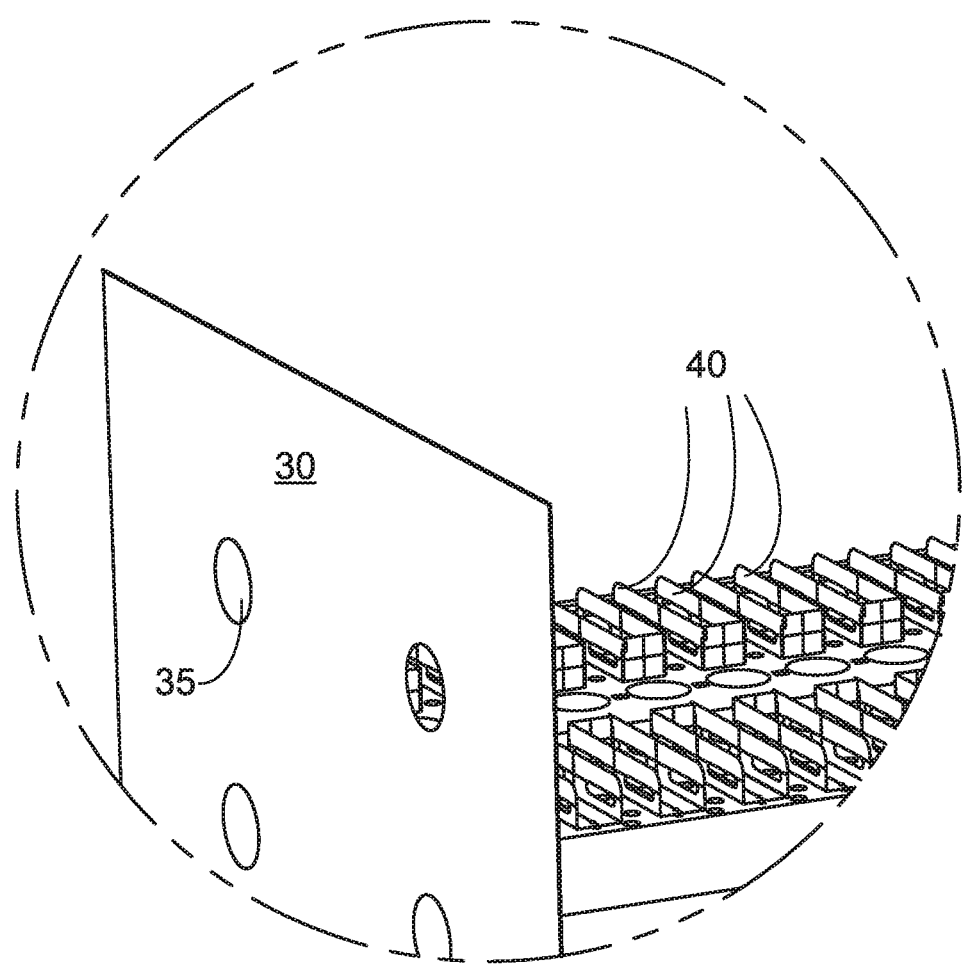
FIG. 3 illustrates a data center mounting rack in accordance with this disclosure, partial, expanded perspective view, showing closer details of a mounting shelf with U-shaped mounting brackets.

FIG. 3 illustrates a data center mounting rack in accordance with this disclosure, perspective view, showing closer details of a mounting shelf, U-shaped mounting brackets, and staggered perforated openings for air flow positioned between the U-shaped mounting brackets. In one embodiment, FIG. 3 corresponds to the top of the data center mounting rack in FIG. 2. In various embodiments, the U-shaped mounting brackets are spaced apart on the shelves of the data center mounting rack to allow for further airflow between the Mac mini computers.

Figure 4:
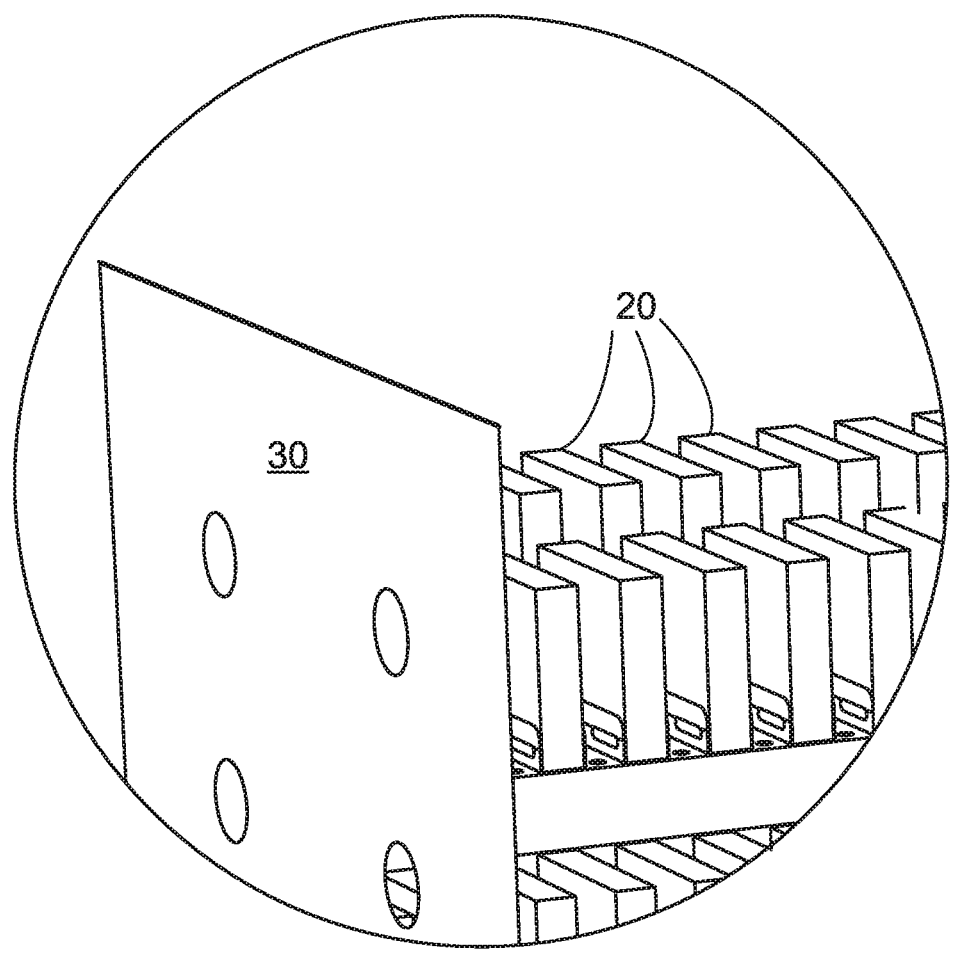
FIG. 4 illustrates a data center mounting rack in accordance with this disclosure, partial, expanded perspective view, showing closer details of an empty mounting shelf.

FIG. 4 illustrates a data center mounting rack 10 in accordance with this disclosure, perspective view, showing closer details of an empty mounting shelf 15, U-shaped mounting brackets 40, and staggered perforated openings 50 for air flow positioned between the U-shaped mounting brackets populated with Mac mini computers. In one embodiment, FIG. 4 corresponds to the top of the data center mounting rack in FIG. 1.

Figure 5:
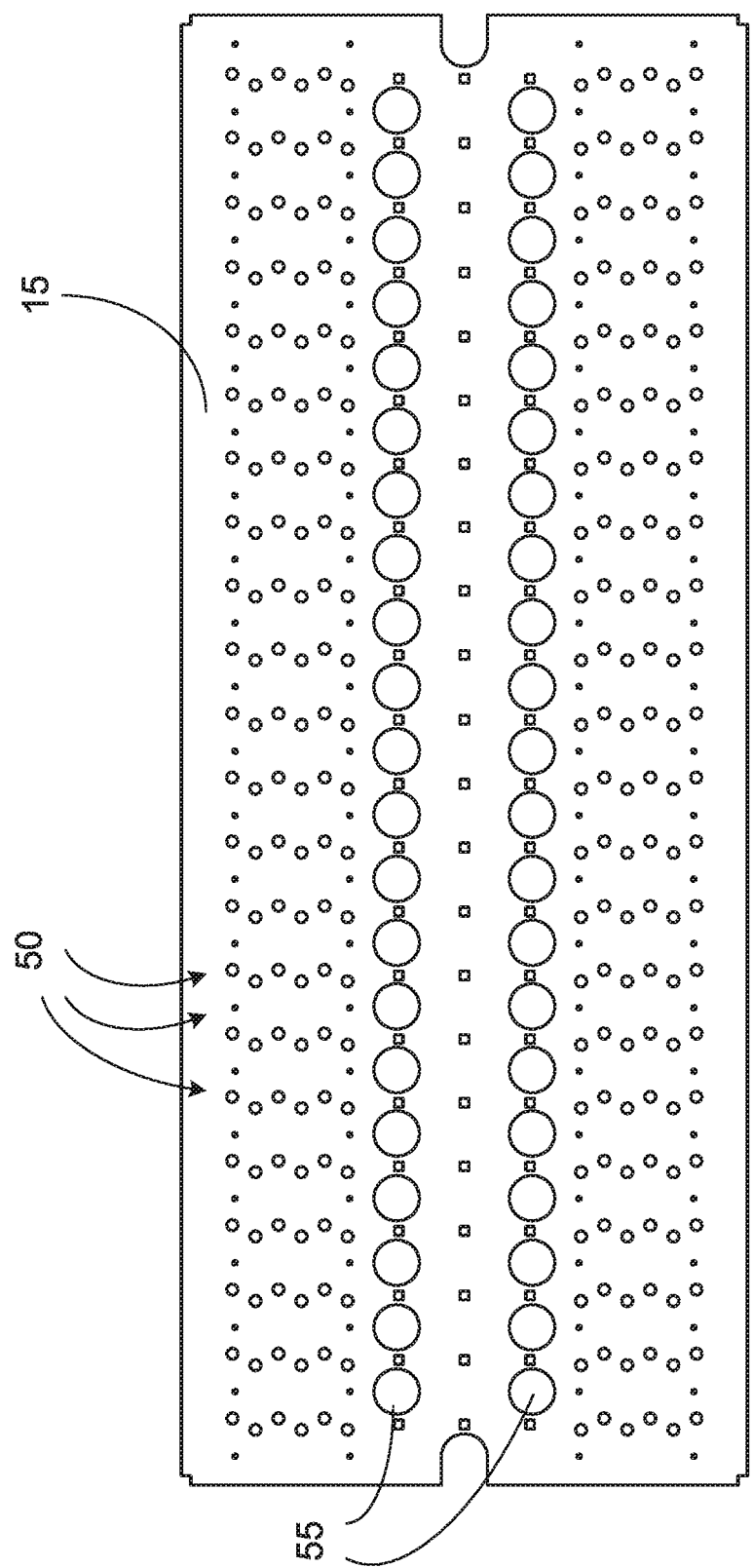
FIG. 5 is a top plan view of a mounting shelf, without U-shaped mounting brackets.

FIG. 5 is a top plan view of a mounting shelf 15, without U-shaped mounting brackets. In various embodiments, the mounting shelf may comprise small holes 50 between the mounting positions where U-shaped mounting brackets would be mounted. In one embodiment, the mounting shelf may comprise six staggered holes 50 between each mounting position, which provide adequate airflow for the Mac mini computers that draw air in through one of the sides that faces the six staggered holes. In various embodiments, the mounting shelf may comprise larger holes 55 directly behind the mounting position (e.g., in the interior of the shelf) that permit additional airflow and provide a location for cables to run between shelves.

Figure 6B:
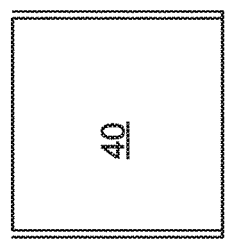
FIG. 6B is a front view of a U-shaped mounting bracket, 46 of which are welded to each shelf of FIG. 5.
Figure 6A:
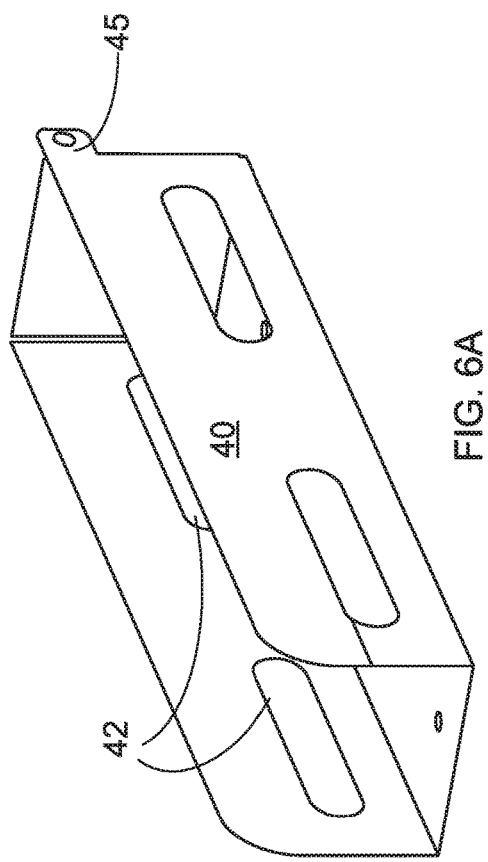
FIG. 6A is a perspective view of a U-shaped mounting bracket, 46 of which are welded to each shelf of FIG. 5.
Figure 6C:
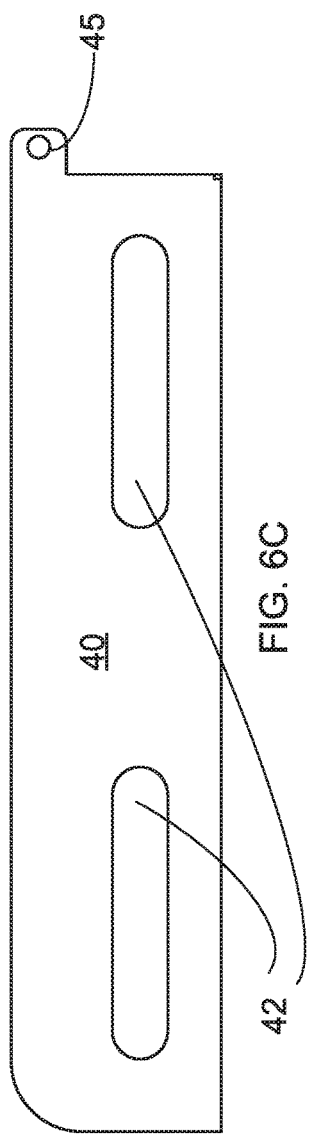
FIG. 6C is a side view of a U-shaped mounting bracket, 46 of which are welded to each shelf of FIG. 5.

Referring now to FIG. 6, consisting of FIGS. 6A through 6D, which show details of a U-shaped mounting bracket 40, 46 of which are welded to each shelf of FIG. 5. According to various embodiments, the perpendicular orientation of the Mac mini computer within the U-shaped mounting bracket enables the rack to hold more Mac mini computers within a given space considering the thermal dissipation demands of the Mac mini computers. In one embodiment, the perpendicular orientation of Mac mini computer may result in airflow flowing into the Mac mini computer from its side (that normally is the bottom) and out through its rear edge. Generally, the U-shaped mounting bracket may be designed to increase the efficiency of this altered airflow pattern.

Still referring to FIG. 6, in various embodiments, the U-shaped mounting bracket 40 is deep enough for a Mac mini computer to sit completely within it, tall/narrow enough to prevent the Mac mini computer from falling over, and short enough to not inhibit air intake of the Mac mini computer. As will be appreciate by one having ordinary skill in the art, the U-shaped mounting bracket prevents the Mac mini computer from moving while also limiting the amount of contact with the surface of the Mac mini computer. Generally, increased contact with the surface of the Mac Pro computer results in decreased temperature control because of residual heat in the metal of the enclosure and decreased airflow around the Mac mini computer. In various embodiments, the sides of the U-shaped mounting bracket may contain multiple obround-shaped holes 42 to promote airflow around the Mac mini that they hold. Further, in one embodiment, the U-shaped mounting bracket comprises a small tab 45 on the rear of one of its sides to add further stability to the design of the U-shaped mounting bracket.

Figure 7A:
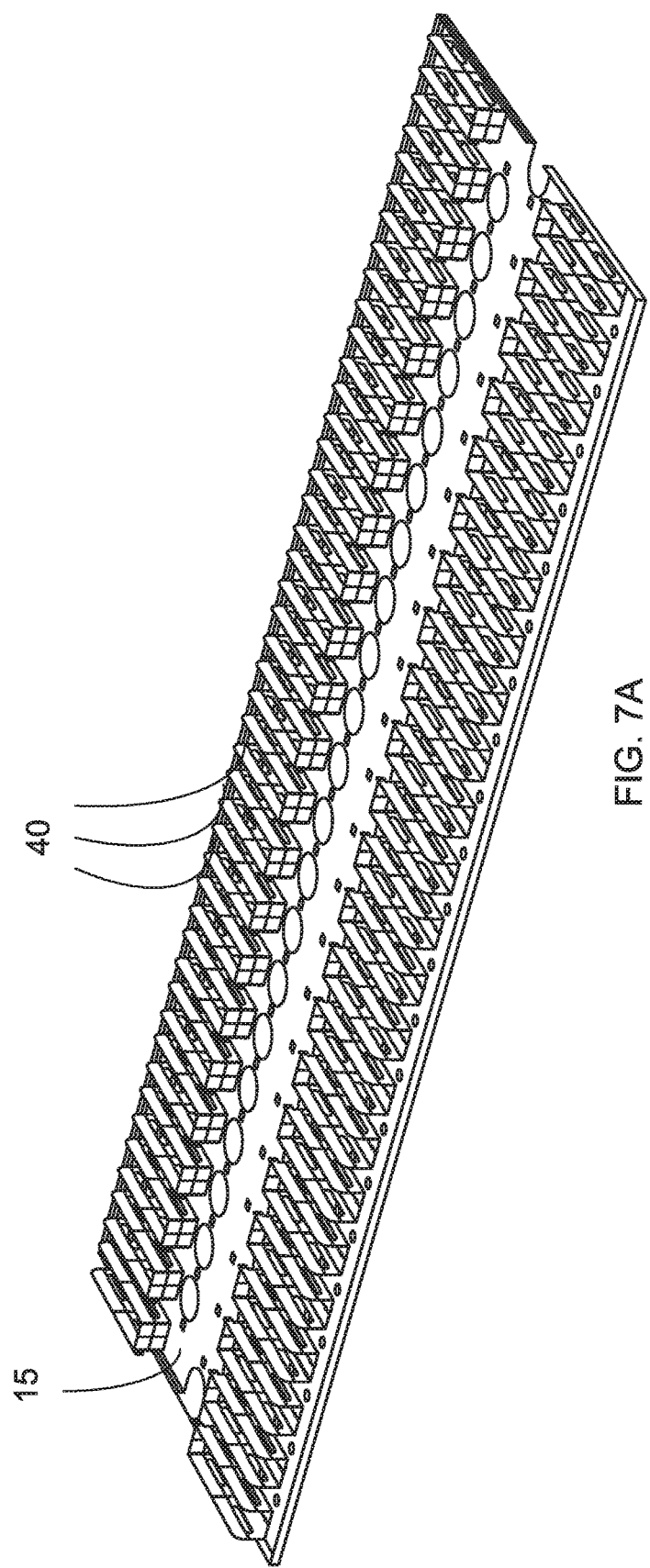
FIG. 7, consisting of FIGS. 7A through 7F, shows details of a complete mounting shelf with U-shaped brackets attached thereto at each of 46 separate mounting positions.
Figure 7B:
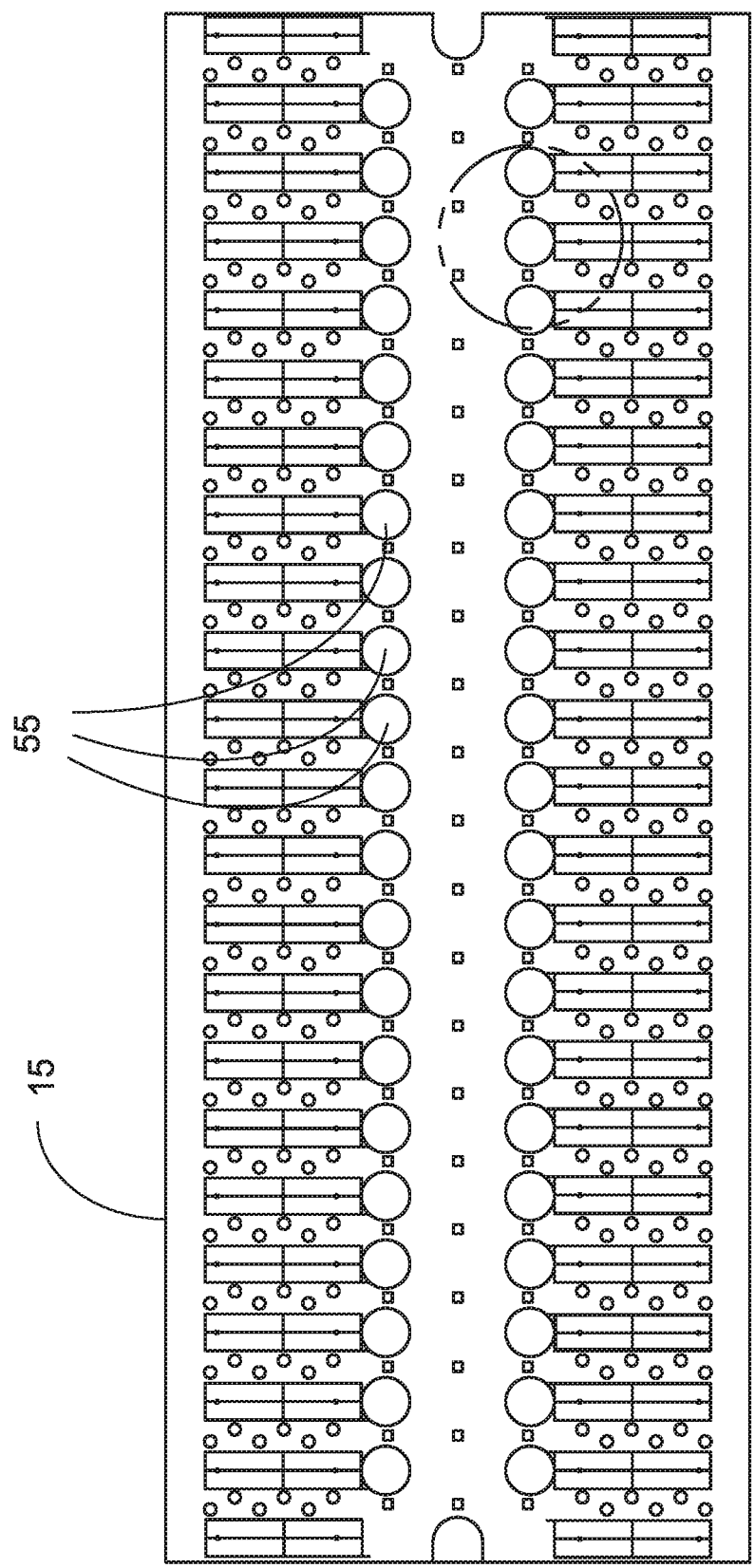
Figure 7F:
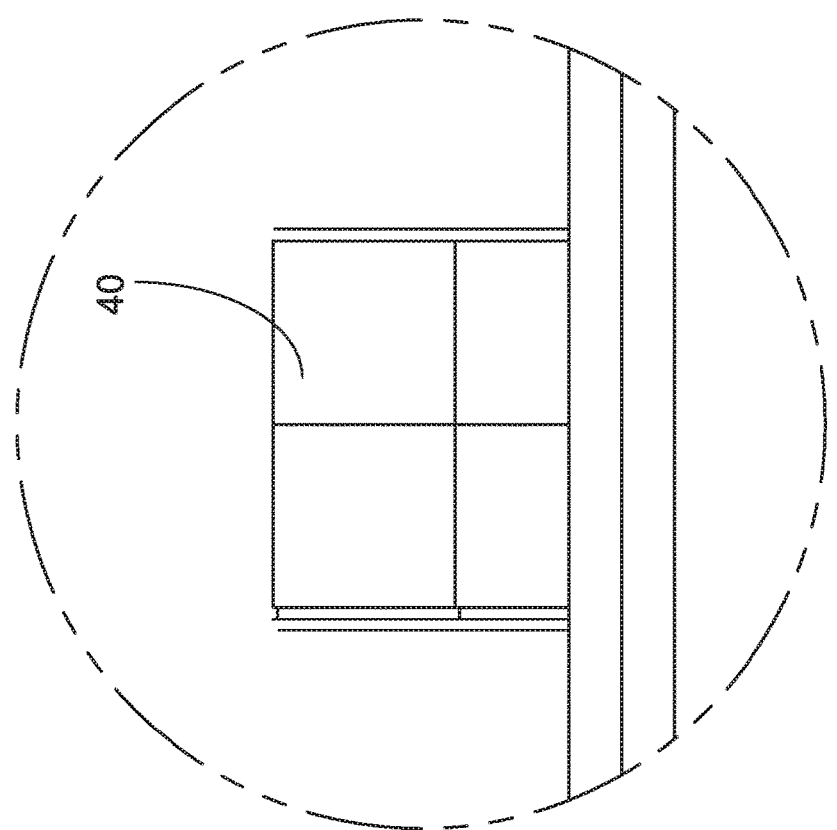
Figure 9A:
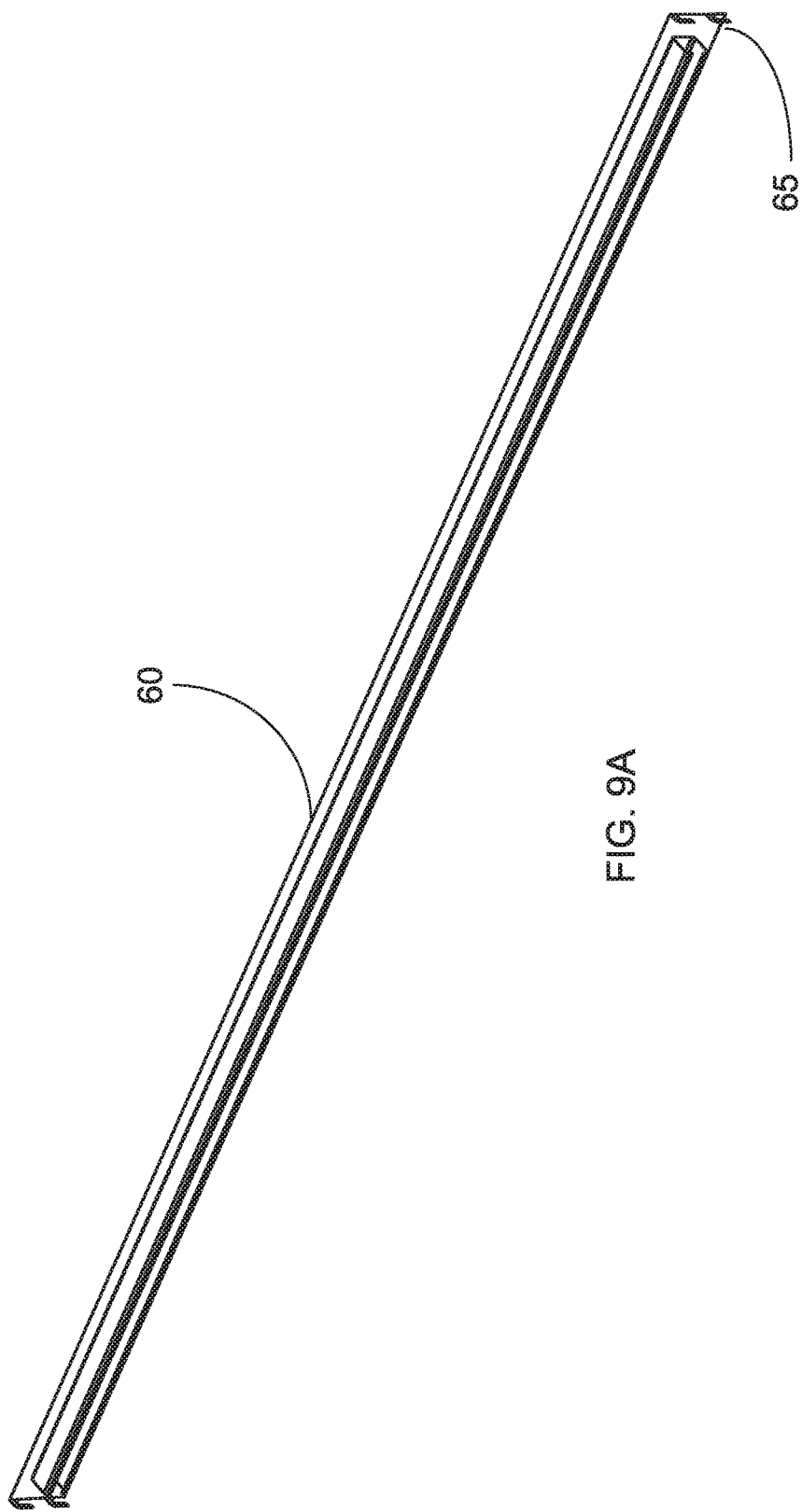
FIG. 9, consisting of FIGS. 9A through 9D, illustrates details of a horizontal support member, four of which are used to construct a full rack, by affixing in pairs to a side panel and support the mounting shelves. Downwardly-facing latches are provided at each end of the support members that match Tennsco® rack openings.
Figure 9B:
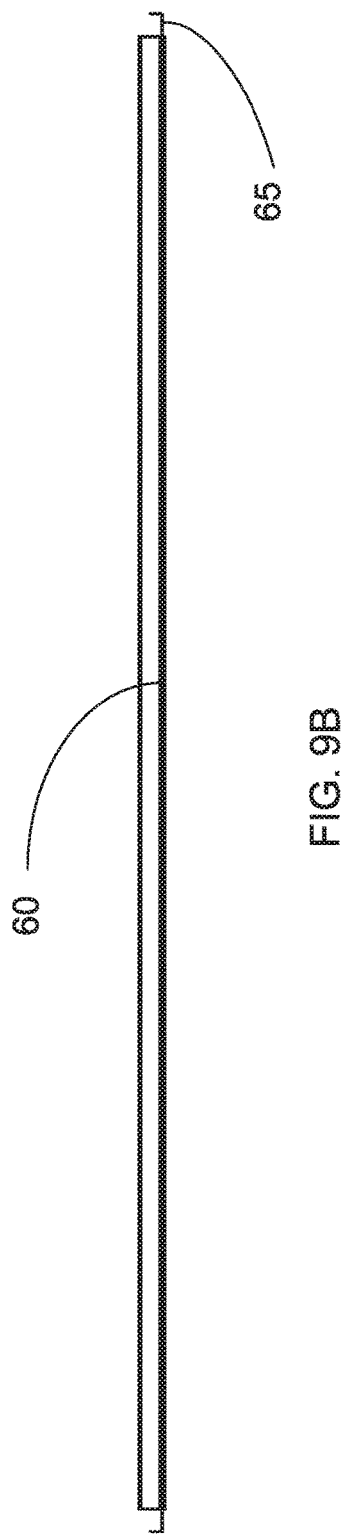
Figure 9C:
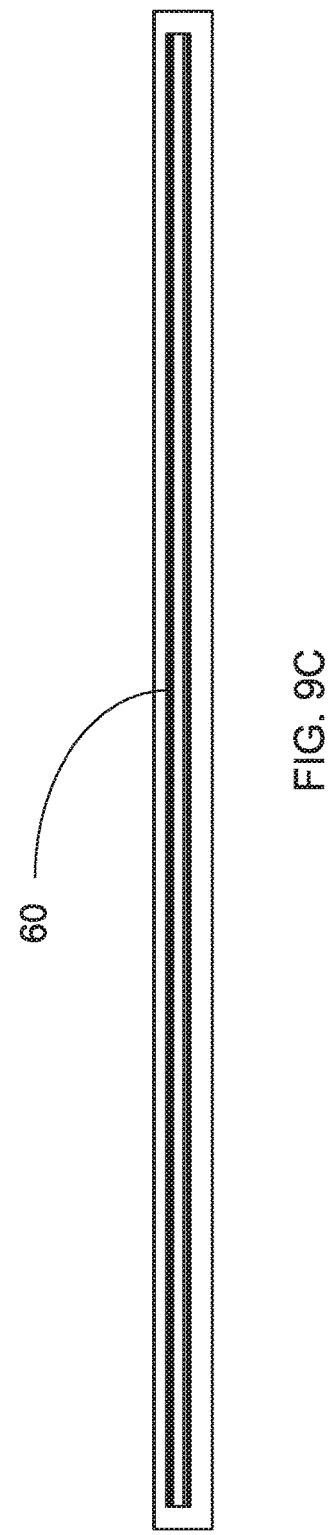
Figure 9D:
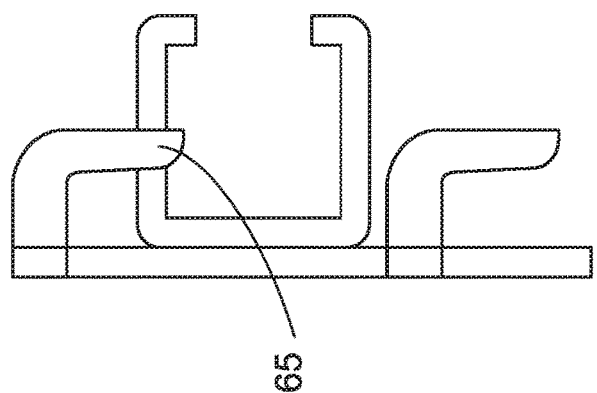

FIG. 7, consisting of FIGS. 7A through 7F, show details of a complete mounting shelf 15 with U-shaped mounting brackets 40 attached thereto at each of 46 separate mounting positions. Generally, in various embodiments, the U-shaped mounting brackets may be welded to the shelves between the small holes and directly in front of the larger holes 55. As will be appreciated by one having ordinary skill in the art, this configuration promotes adequate air flow and provides a location for the cables. In various embodiments, the U-shaped mounting brackets are mounted on opposites sides of the shelf 15 (as illustrated in FIG. 7E).

FIG. 8 illustrates a plan and elevation view of a side panel 30 of the data center mounting rack. In various embodiments, the side panel contains large holes for cables to run through and to promote adequate airflow. As will be appreciated by one having ordinary skill in the art, these holes may be spaced evenly with the shelves of the data center mounting rack.

FIG. 9, consisting of FIGS. 9A through 9D, illustrates details of a horizontal support member 60, four of which are used to construct a full rack, by affixing in pairs to a side panel 30 and support the mounting shelves 15. Downwardly-facing latches 65 are provided at each end of the support members that match Tennsco® rack openings.

Figure 10:
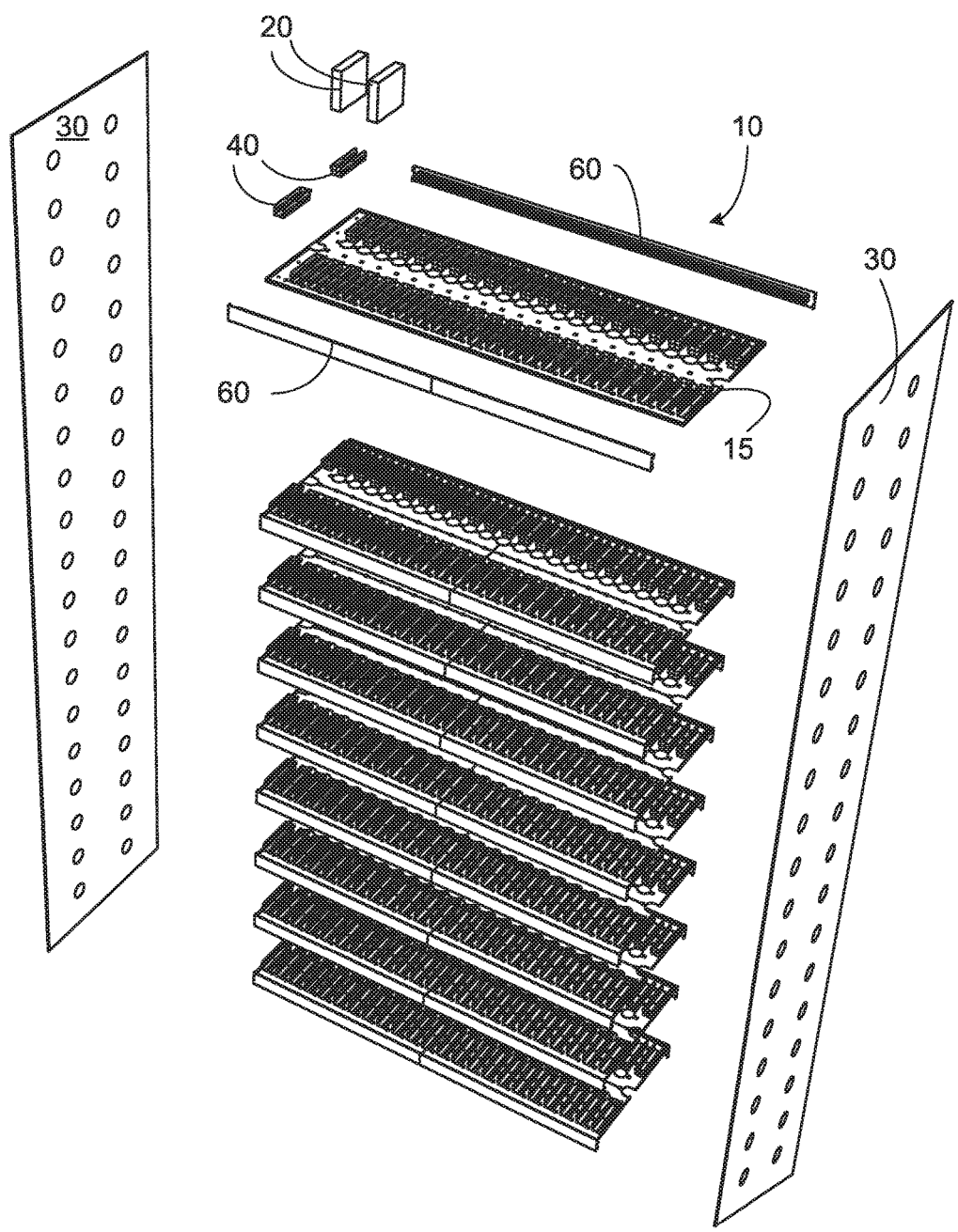
FIG. 10 is an exploded view of a complete 10-shelf data center mounting rack, illustrating how the horizontal support members are affixed to the end panels.

FIG. 10 is an exploded view of a complete 10-shelf data center mounting rack 10, illustrating how the horizontal support members 60 are affixed to the end panels.

From the foregoing, it will be understood that the spacing of the U-shaped mounting brackets, dimensions and spacing of the staggered openings for air flow in between U-shaped mounting brackets, spacing of the shelves relative to each other, openings in side panels for cabling of communications and power, slide-in mounting arrangement, side-panel mounting for power and telecommunications components, front and rear accessibility for dual side mounting of computers, all contribute to a novel and nonobvious arrangement for small form data center computers such as Mac minis, in a highly optimal configuration to include as many computers as possible given a floor footprint, cabling access and routing, and cooling air flow capability to maintain the array within specified operating temperatures in the data center.

The foregoing description of the exemplary embodiments has been presented only for the purposes of illustration and description and is not intended to be exhaustive or to limit the inventions to the precise forms disclosed. Many modifications and variations are possible in light of the above teaching.

The embodiments were chosen and described in order to explain the principles of the inventions and their practical application so as to enable others skilled in the art to utilize the inventions and various embodiments and with various modifications as are suited to the particular use contemplated. Alternative embodiments will become apparent to those skilled in the art to which the present inventions pertain without departing from their spirit and scope. Accordingly, the scope of the present inventions is defined by the appended claims rather than the foregoing description and the exemplary embodiments described therein.

What is claimed is:

1. A data center mounting rack for mounting and supporting a plurality of generally rectangular small form computer systems in a vertically stacked arrangement, said rectangular small form computer systems each comprising a top surface, a bottom surface, and side surfaces wherein the top and bottom surfaces are larger than the side surfaces, so that each of the rectangular small form computer systems can be placed on one of the side surfaces, with the top and bottom surfaces extending vertically and thereby defining a vertical mounting orientation, comprising:

a shelving arrangement comprising a pair of spaced apart vertical end panels supporting a plurality of horizontal mounting shelves, each of the horizontal mounting shelves including a pair of rows of spaced apart first openings positioned in a central region of each of the mounting shelves, each row of first openings extending along a length of each one of said mounting shelves extending between the vertical end panels, for allowing the passage therethrough of cabling for said rectangular mall form computer systems mounted to said shelf and for permitting cooling air flow in a vertical direction;

each of the horizontal mounting shelves including a plurality of rows of spaced apart air flow openings, in a staggered arrangement, positioned on each of the mounting shelves along a first line extending across a width of each of the mounting shelves and spaced apart from a second line extending across the width of each of the mounting shelves between two of said first openings, for permitting air flow in a vertical direction directed alongside the top surface and bottom surface of a rectangular small form computer system positioned in the vertical mounting orientation;

each of the horizontal mounting shelves including computer system mounting enclosure surfaces extending in a direction across the width extending between a front and a rear of the mounting shelves, positioned between a row of said spaced apart air flow openings; and a plurality of U-shaped computer system mounting brackets mounted along the computer system mounting enclosure surfaces, a pair of said mounting brackets positioned between a pair of said first lines extending across the width of each of the mounting shelves shelf between two of said first openings and between two rows of said spaced apart air flow openings, whereby each of said U-shaped computer system mounting brackets supports one of said rectangular small form computer systems in the vertical mounting orientation such that air flow is directed along said top surface and said bottom surface by said spaced apart air flow openings to aid in cooling.

2. The data center mounting rack of claim 1, wherein each U-shaped mounting bracket is welded to a respective one of the horizontal mounting shelves.

3. The data center mounting rack of claim 1, wherein each U-shaped mounting bracket includes at least one obround opening positioned along upwardly extending sides of the "U" of the bracket to provide additional cooling exposure for a small form computer system mounted therein.

4. The data center mounting rack of claim 1, wherein the diameters of the spaced apart air flow openings are smaller than the diameter of the first openings.

5. The data center mounting rack of claim 1, wherein the staggered arrangement of the spaced apart air flow openings comprises openings that alternate between a left side and a right side of said first line extending across the width of each of the mounting shelves.

6. The data center mounting rack of claim 1, wherein each row of the spaced apart air flow openings comprises at least six holes.

7. The data center mounting rack of claim 1, wherein each of the small form computer systems is an Apple Mac mini.

8. The data center mounting rack of claim 1, wherein each small form computer system is mounted in a U-shaped mounting bracket such that data and power cabling from a rear side surface of the computer system extends inwardly towards one of the first openings on a respective one of the mounting shelves.

* * * * *